United States Patent
Sakurayama et al.

(10) Patent No.: US 11,477,927 B2
(45) Date of Patent: Oct. 18, 2022

(54) COMPONENT MOUNTING SYSTEM AND COMPONENT MOUNTING METHOD

(71) Applicant: FUJI CORPORATION, Chiryu (JP)

(72) Inventors: Takeshi Sakurayama, Nisshin (JP); Kota Niwa, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 607 days.

(21) Appl. No.: 16/484,864

(22) PCT Filed: Feb. 20, 2017

(86) PCT No.: PCT/JP2017/006129
§ 371 (c)(1),
(2) Date: Aug. 9, 2019

(87) PCT Pub. No.: WO2018/150573
PCT Pub. Date: Aug. 23, 2018

(65) Prior Publication Data
US 2019/0380235 A1    Dec. 12, 2019

(51) Int. Cl.
*B23P 19/00* (2006.01)
*H05K 13/04* (2006.01)
(Continued)

(52) U.S. Cl.
CPC ..... *H05K 13/0409* (2018.08); *H05K 13/0015* (2013.01); *H05K 13/0452* (2013.01); *H05K 13/0465* (2013.01); *H05K 13/02* (2013.01)

(58) Field of Classification Search
CPC ............. H05K 13/0015; H05K 13/02; H05K 13/0409; H05K 13/0452; H05K 13/0465;
(Continued)

(56) References Cited

U.S. PATENT DOCUMENTS 4,916,805 A * 4/1990 Ellrich .................... H01L 24/83
29/841
10,217,675 B2   2/2019 Karch
(Continued)

FOREIGN PATENT DOCUMENTS

CN    1367371 A  *  9/2002  ......... G01N 21/8806
EP    3 071 006 A1    9/2016
(Continued)

OTHER PUBLICATIONS

Extended European Search Report dated Jan. 20, 2020 in Europen Patent Application No. 17896664.4, 8 pages.
(Continued)

*Primary Examiner* — Paul D Kim
(74) *Attorney, Agent, or Firm* — Oblon, McClelland, Maier & Neustadt, L.L.P.

(57) ABSTRACT

In the component mounting system, when an electronic component having a positioning target is held and mounted onto the upper face of a board, the positioning target is aligned to a predetermined position of the board. The component mounting system detects a positional deviation of the positioning target on the upper face of the electronic component and performs an arrangement operation of arranging a positioning material on the board by correcting the arrangement position in accordance with the detected positional deviation. The component mounting system then performs a mounting operation for mounting the electronic component on the board by aligning the positioning target to the predetermined position of the board on which the positioning material has been arranged.

6 Claims, 10 Drawing Sheets

(51) Int. Cl.
*H05K 13/00* (2006.01)
*H05K 13/02* (2006.01)

(58) Field of Classification Search
CPC ........... H05K 13/0469; H05K 13/0813; H05K 13/0815
See application file for complete search history.

(56) References Cited

U.S. PATENT DOCUMENTS

2015/0364384 A1    12/2015   Karch
2019/0189526 A1     6/2019   Karch

FOREIGN PATENT DOCUMENTS

JP        2016-181723 A    10/2016
WO   WO 2016/094913 A1    6/2016

OTHER PUBLICATIONS

International Search Report dated May 16, 2017 in PCT/JP2017/006129 filed on Feb. 20, 2017.

\* cited by examiner

COMPONENT MOUNTING SYSTEM AND COMPONENT MOUNTING METHOD

TECHNICAL FIELD

This specification discloses a component mounting system and a component mounting method.

BACKGROUND ART

Conventionally, there has been proposed a component mounter in which a light-emitting element is mounted on a board by solder bonding (see, for example, Patent Literature 1). In the component mounter described in Patent Literature 1, an adhesive for fixing the light-emitting element to the board is disposed first on the upper face of the board. Next, the component mounter detects the position of the light-emitting element in addition to detecting any positional deviation between the position of the light-emitting section and the component center of the light-emitting element. When mounting the light-emitting element on the board, the component mounter mounts the light-emitting element by using the detected positional deviation and the position of the light-emitting element to shift the mounting position of the light-emitting element by the positional deviation.

PATENT LITERATURE

Patent Literature 1: JP-A-2016-181723

BRIEF SUMMARY

Technical Problem

In the component mounter described above, if the mounting position of the light-emitting device is shifted by an amount equal to the positional deviation when there is a positional deviation between the light-emitting section and the component center, the mounting position of the light-emitting element (i.e., the element body) deviates from the arrangement position of the adhesive (i.e., the positioning material). As a result, depending on the arrangement position of the adhesive, the light-emitting element may not be sufficiently in contact with the adhesive and therefore may not become positioned (i.e., fixed) on the board.

It is a main object of the present disclosure to arrange a positioning material so that an electronic component can be properly positioned in cases where the positioning target of the electronic component is aligned to a predetermined position on the board.

Solution to Problem

The present disclosure achieves the above-mentioned main object in the following manner.

The present disclosure provides a component mounting system configured to hold an electronic component having a positioning target on an upper face thereon and mount the electronic component on a board by performing alignment so as to position the positioning target at a predetermined position on a board, the component mounting system including: at least one head configured to be used for an arrangement operation for arranging positioning material for positioning the electronic component relative to the board, and a mounting operation for mounting the electronic component on the board; a positional deviation detection device configured to detect positional deviation of the positioning target on the upper face of the electronic component; and a control device configured to execute the arrangement operation by controlling the head so as to arrange the positioning material on the board by correcting the arrangement position based on the positional deviation of the positioning target on the upper face of the electronic component detected with the positional deviation detection device, and the mounting operation by controlling the head so as to align the positioning target to the predetermined position on the board on which the positioning material has been arranged and mount the electronic component on the board.

In the component mounting system, when the electronic component having a positioning target on an upper thereon is held and mounted on a board, the positioning target is aligned to a predetermined position of the board. The component mounting system detects a positional deviation of the positioning target on the upper face of the electronic component and performs an arrangement operation of arranging a positioning material on the board by correcting the arrangement position in accordance with the detected positional deviation. The component mounting system then performs a mounting operation for mounting the electronic component on the board by aligning the positioning target to the predetermined position of the board on which the positioning material has been arranged. This makes it possible to arrange a positioning material so that an electronic component can be properly positioned in cases where the positioning target of the electronic component is aligned so as to position and mount the electronic component at a predetermined position on the board.

DESCRIPTION OF EMBODIMENTS

Next, an embodiment of the present disclosure will be described with reference to the drawings.

Figure 1:
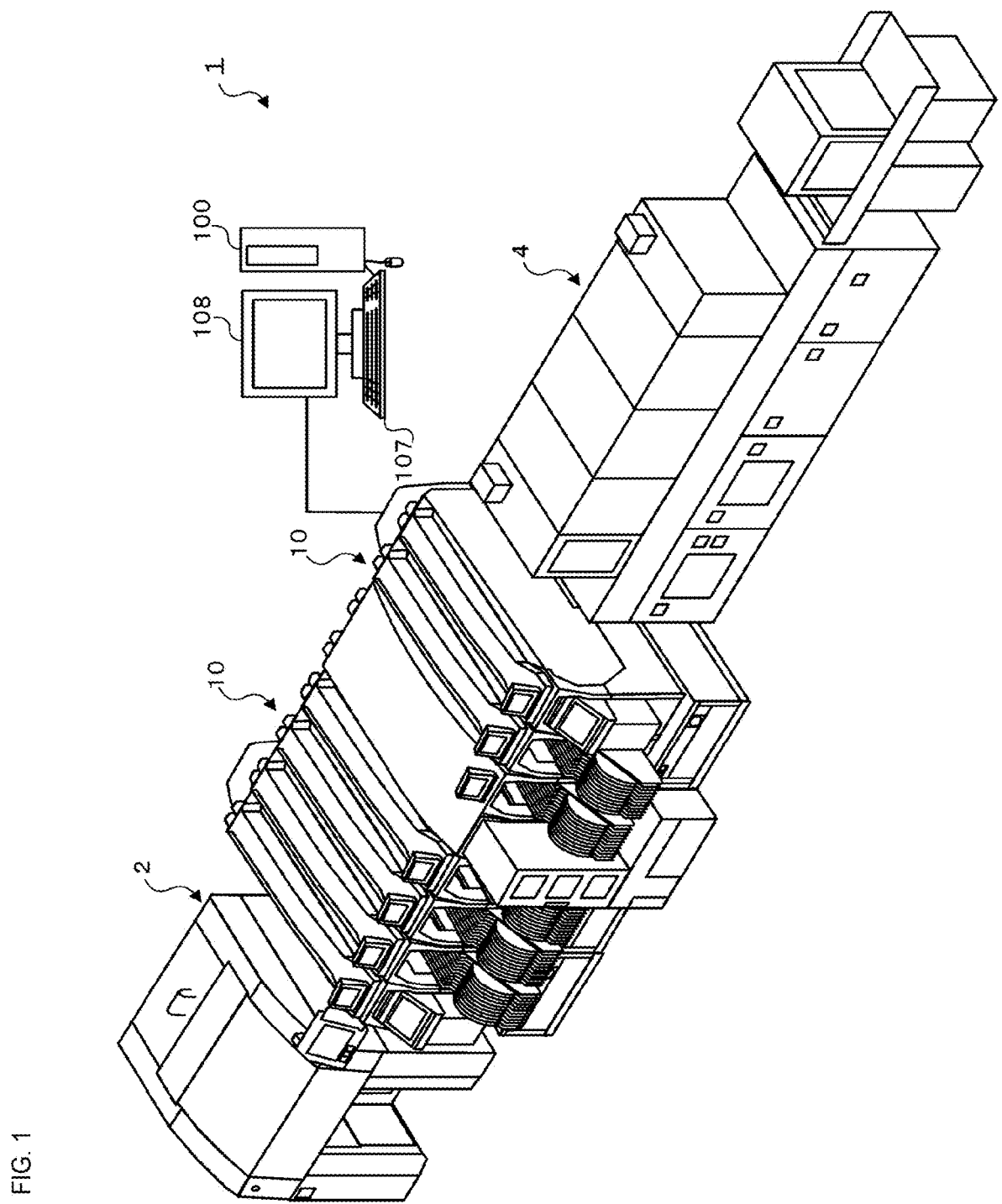
FIG. 1 A schematic configuration diagram showing component mounting system 1 as an embodiment of the present disclosure.
Figure 2:
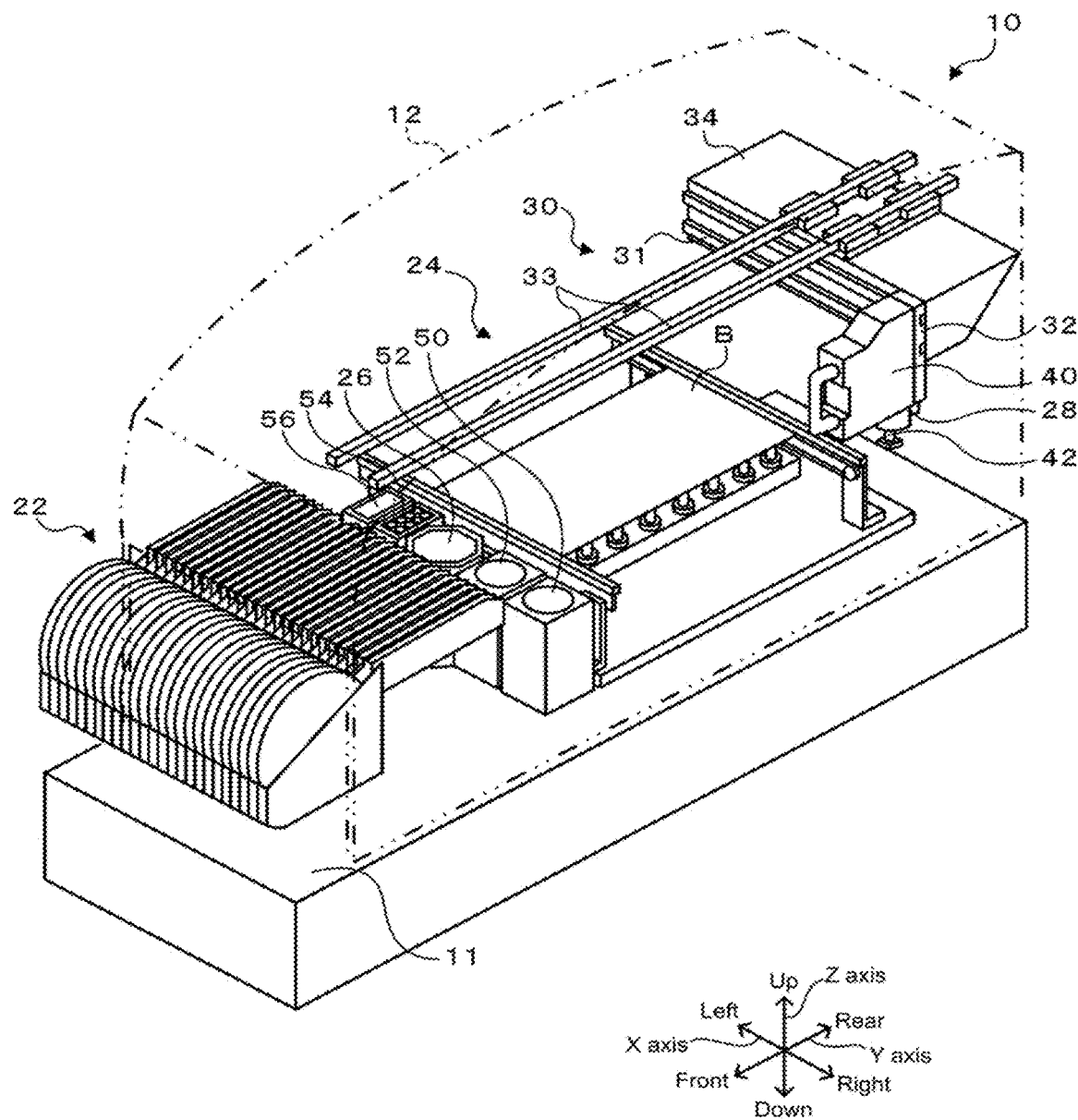
FIG. 2 A schematic configuration diagram showing component mounter 10.
Figure 3:
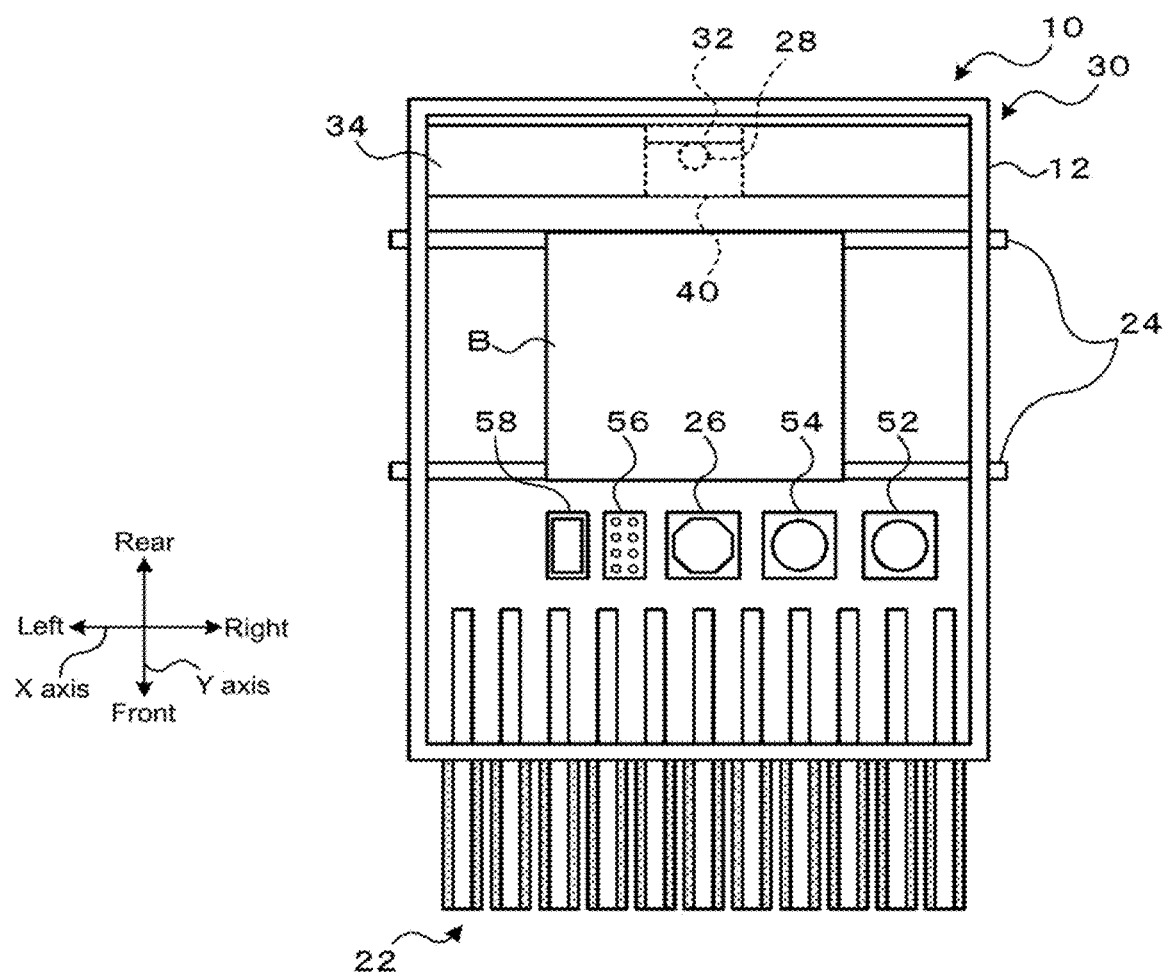
FIG. 3 A top view showing component mounter 10.
Figure 4:
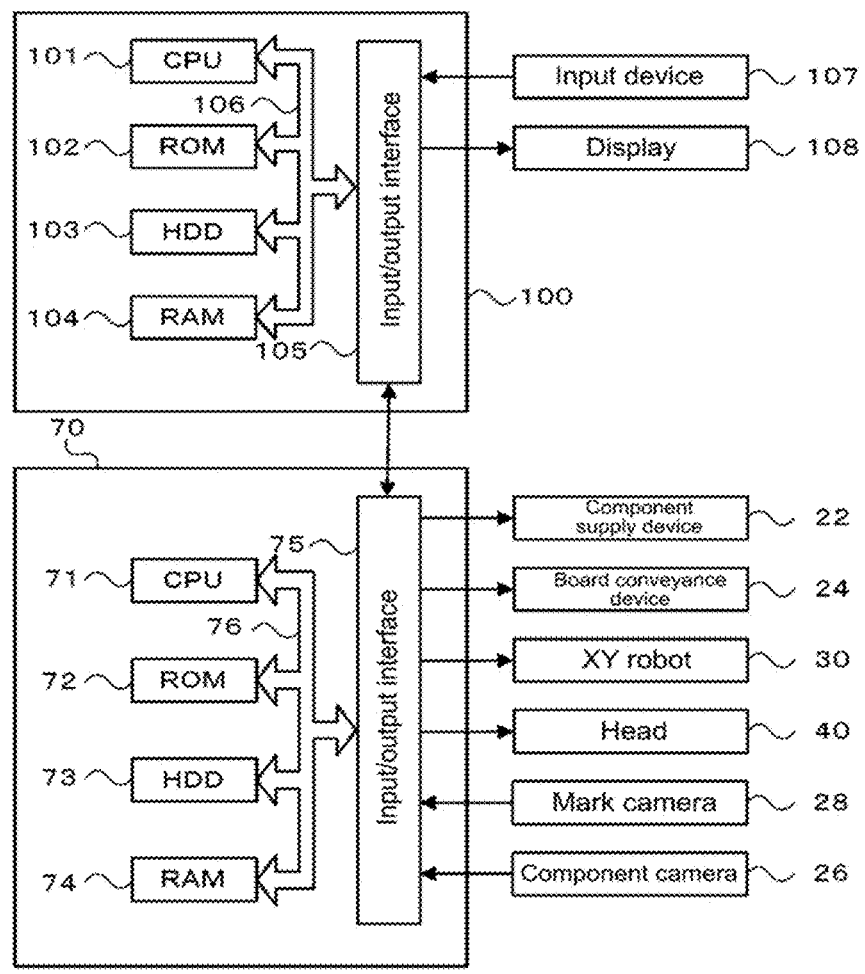
FIG. 4 A block diagram showing electrical connections between control device 70 and management device 100.

FIG. 1 is a schematic configuration diagram showing component mounting system 1 according to an embodiment of the present disclosure. FIG. 2 is a schematic configuration diagram showing component mounter 10. FIG. 3 is a top view showing component mounter 10. FIG. 4 is a block diagram showing electrical connections between control device 70 and management device 100. In the present embodiment, the left-right direction in FIG. 2 is the X-axis direction, the front-rear direction is the Y-axis direction, and the up-down direction is the Z-axis direction.

As shown in FIG. 1, component mounting system 1 includes screen printing device 2, component mounter 10, reflow oven 4, management device 100 for managing the entire system, and the like. Screen printing device 2 is a device in which solder on a screen is pressed onto pattern holes formed in the screen while the solder is rolled with a squeegee, thereby printing a wiring pattern (i.e., a solder surface) onto board B below through the pattern holes. Component mounter 10 picks up an electronic component (hereinafter, simply referred to as a "component") and mounts the component on board B on which solder is printed. Reflow furnace 6 heats board B on which the component is mounted, thereby melting the solder on board B to perform solder bonding.

As shown in FIG. 2, component mounter 10 includes base 11, housing 12, component supply device 22, board conveyance device 24, XY robot 30, head 40, control device 70 (see FIG. 4), and the like. In addition to these, component mounter 10 also includes component camera 26, mark camera 28, and the like. Component camera 26 is provided on base 11 and is for imaging a component picked up by head 40 from below. Mark camera 28 is provided on head 40 and images a component supplied by component supply device 22 from above, or images a positioning reference mark attached to board B from above. Component mounter 10 further includes mounting tool station 52, glue tool station 54, nozzle station 56, discard box 58, and the like on base 11. Mounting tool station 52 is configured as an accommodation section for receiving a mounting tool having a suction nozzle. Glue tool station 54 is configured as an accommodation section for receiving a glue tool having a dispenser. Nozzle station 56 is configured as an accommodation section for receiving multiple suction nozzles. Discard box 58 is a box for discarding defective components.

Component supply device 22 is configured as a tape feeder which pulls out a tape in which components are accommodated at predetermined intervals from a reel and feeds the tape toward a supply position at a pitch. A film is adhered to the upper surface of the tape and is peeled off before the supply position, and the tape is fed to the supply position with the components exposed. Multiple component supply devices 22 are provided at the front of component mounter 10 so as to be aligned in the left-right direction (X-axis direction).

Board conveyance device 24 has a pair of conveyor belts disposed in the front-rear direction in FIG. 2 with a space therebetween and mounted in the left-right direction. Board B is conveyed from the left to the right in the drawing by the conveyor belts of board conveyance device 24.

XY robot 30 moves head 40 in the XY-axis direction and includes X-axis slider 32 and Y-axis slider 34, as shown in FIG. 1. X-axis slider 32 is supported by X-axis guide rails 31 provided on the front face of Y-axis slider 34 so as to extend in the X-axis direction and is movable in the X-axis direction through the driving of an X-axis motor (not shown). Y-axis slider 34 is supported by a pair of left and right Y-axis guide rails 33 provided on the upper level section of housing 12 so as to extend in the Y-axis direction and is movable in the Y-axis direction through the driving of a Y-axis motor (not shown). Head 40 is attached to X-axis slider 32. Therefore, head 40 can be moved to any position on the XY plane through the driving and controlling by XY robot 30 (i.e., X-axis motor and Y-axis motor).

Head 40 is configured such that multiple types of tools including a mounting tool, a glue tool, and the like can be attached and detached, and different functions are provided depending on the tool that is attached. For example, when a mounting tool is attached, head 40 can perform a mounting operation in which the upper face of a component supplied by component supply device 22 is picked up by the suction nozzle of the mounting tool and mounted on board B. Further, when the glue tool is attached, head 40 can perform an application operation of applying an adhesive onto board B by a dispenser provided in the glue tool.

As shown in FIG. 4, control device 70 is a microprocessor configured with CPU 71 as its centerpiece, and, in addition to CPU 71, includes ROM 72, HDD 73, RAM 74, input/output interface 75, and the like. These are connected via bus 76. For example, a position signal from a position sensor (not shown) for detecting the position of XY robot 30 in the XY direction, an image signal from component camera 26, mark camera 28, and the like are inputted to control device 70. On the other hand, various control signals are outputted from control device 70 to component supply device 22, board conveyance device 24, the X-axis motor and the Y-axis motor of XY robot 30, component camera 26, mark camera 28, and the like.

Managing device 100 is a general-purpose computer, and includes CPU 101, ROM 102, HDD 103, RAM 104, input/output interface 105, and the like, as shown in FIG. 4. An input signal from input device 107 is inputted to management device 100 via input/output interface 105. A display signal to display 108 is outputted from management device 100 via input/output interface 105. HDD 103 stores job information including production programs of board B and other production information. Here, the production program is a program that decides on which component 60 is mounted on which board B in which order in component mounter 10, and how many boards B mounted in such a manner are produced. The production information includes component information (i.e., type of component and supply position thereof) relating to the component to be mounted, tool information relating to the tool to be used, target arrangement position (XY coordinates) of the adhesive, target mounting position (XY coordinates) of the component, and the like. Management device 100 is communicably connected to control device 70 of component mounter 10, and exchanges various information and control signals.

Figure 5:
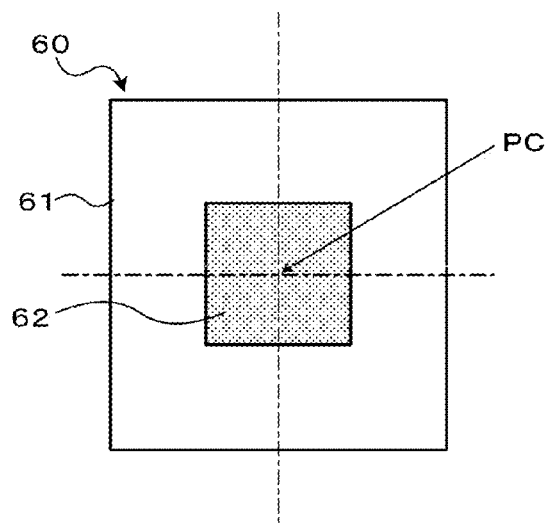
FIG. 5 A top view showing an example of component 60.
Figure 6:
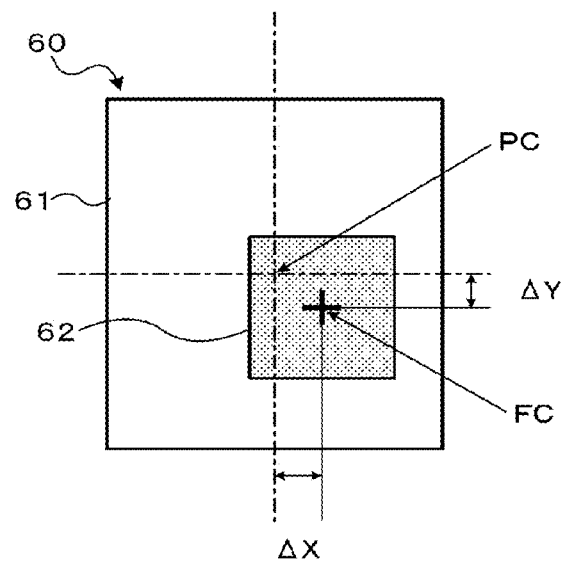
FIG. 6 A diagram showing a variation of positioning target 62.

FIG. 5 is a top view showing an example of component 60. Component 60 is a light-emitting element in which light-emitting section 62 is provided on the upper face of component body 61, and electrode 63 is provided on the lower face of component body 61. When mounting a component such as component 60 on board B, component mounter 10 is required to align the light-emitting center (i.e., the center of positioning target) of light-emitting section 62 with respect to board B. Here, as shown in FIG. 6, in the manufacturing process of component 60, there is variation in the position of light-emitting section 62 with respect to the component outer shape. In the example of FIG. 6, light-emitting center FC of light-emitting section 62 deviates by $\Delta X$ in the left-right direction (X-axis direction) and deviates by $\Delta Y$ in the up-down direction (Y-axis direction) relative to the original position (here, component center PC). In this case, in the mounting step, component 60 is mounted on board B so that light-emitting center FC coincides with the target mounting position of board B. However, there are cases in which light-emitting center FC of component 60 is bonded to board B at a position displaced from the target mounting position by self-alignment in which melted solder is attracted to electrode 63 by surface tension during the solder bonding step after the mounting step. Therefore, in component mounter 10 of the present embodiment, when mounting component 60 including a positioning target such as light-emitting section 62, component 60 is fixed to board B by positioning material such as thermosetting adhesive when component 60 is mounted on board B by arranging the positioning material in advance.

Figure 7:
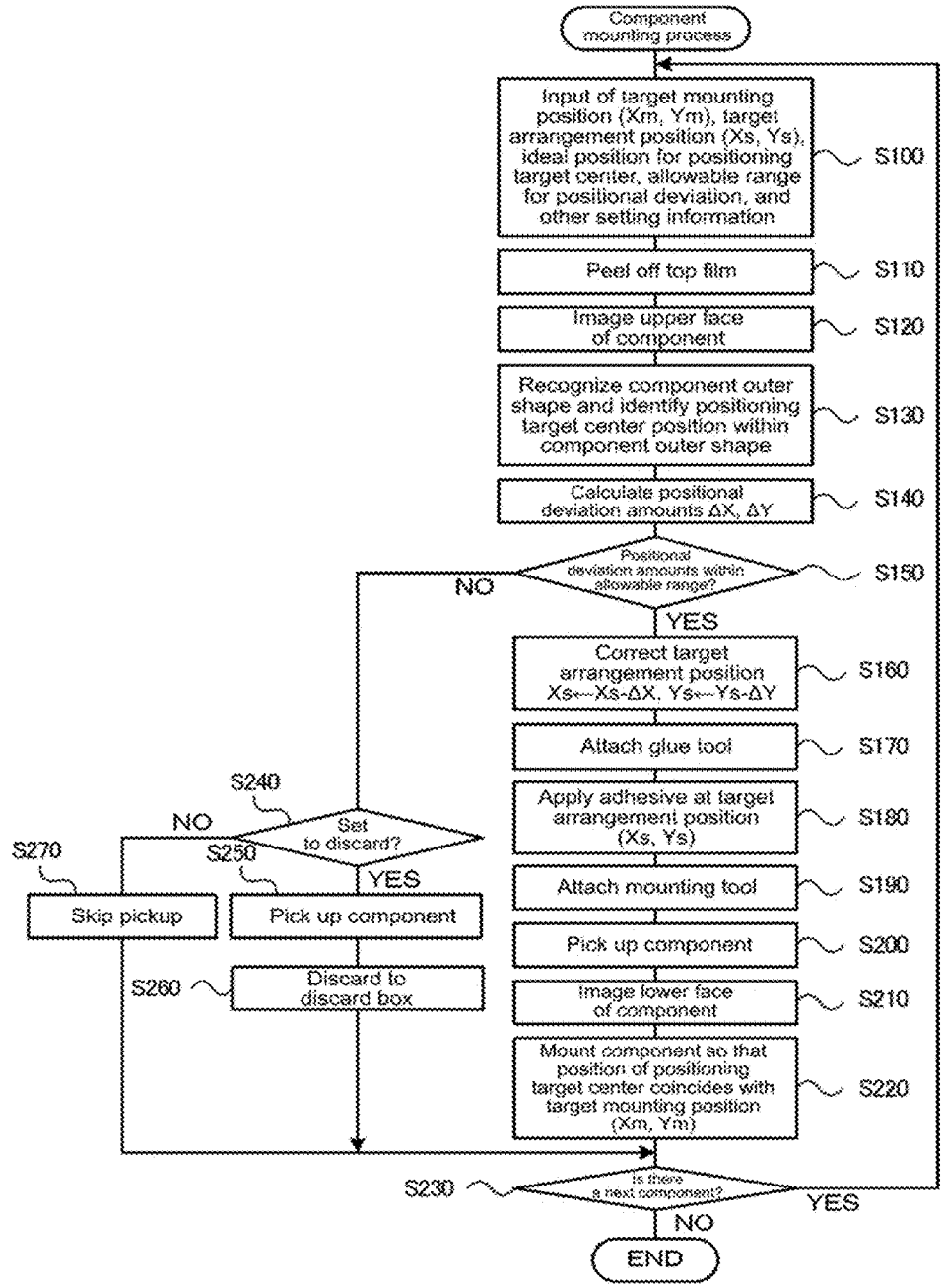
FIG. 7 A flow chart showing an example of a component mounting process.
Figure 8A:
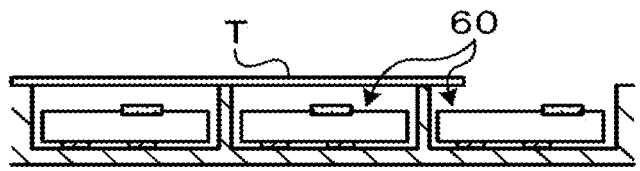
FIG. 8A A diagram showing a film-peeling step.
Figure 8B:
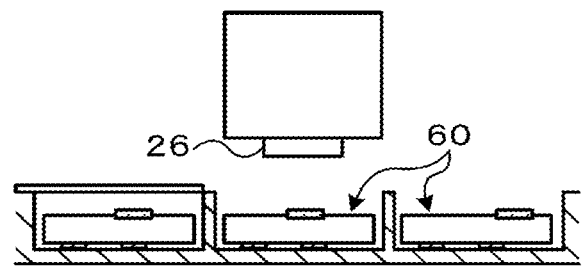
FIG. 8B A diagram showing an imaging step.
Figure 8C:
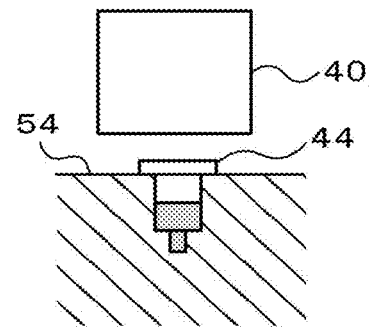
FIG. 8C A diagram showing a glue tool attachment step.
Figure 8D:
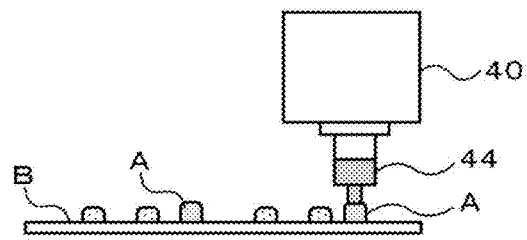
FIG. 8D A diagram showing an adhesive application step.
Figure 8E:
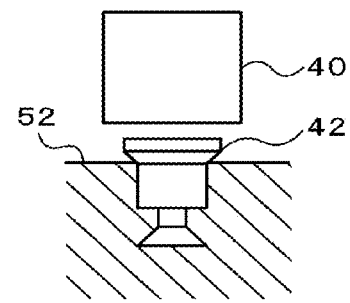
FIG. 8E A diagram showing a mounting tool attachment step.
Figure 8F:
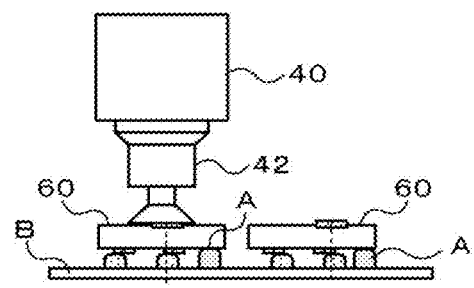
FIG. 8F A diagram showing a component mounting step.

Next, the operation of component mounter 10 of the present embodiment configured as described above, in particular, the operation of mounting component 60 including the positioning target on the upper face of board B, so that the center of the positioning target coincides with the target mounting position of board B, will be described. FIG. 7 is a flowchart showing an example of the component mounting process. The component mounting process is executed when job information is received from management device 100. Hereinafter, the component mounting process will be described with reference to the diagrams of the respective steps shown in FIG. 8. FIG. 8A is a diagram showing a film-peeling step. FIG. 8B is a diagram showing an imaging step. FIG. 8C is a diagram showing a glue tool attachment step. FIG. 8D is a diagram showing an adhesive application step. FIG. 8E is a diagram showing a mounting tool attachment step. FIG. 8F is a diagram showing a component mounting step.

When the component mounting process is executed, CPU 71 of control device 70 first receives a target mounting position (Xm, Ym) of the component, a target arrangement position (Xs, Ys) of the adhesive as the positioning material, an ideal position of the positioning target center, an allowable range for the positional deviation, and other settings (S100). An ideal position of the positioning target center is the ideal position of the positioning target center in the component outer shape, and here, component center PC is used. The allowable range for the positional deviation is a range that determines how much deviation is allowable between the actual position of the positioning target center in the outer shape of component 60 to be mounted and the ideal position of the positioning target center, i.e., component center PC. The other settings include, for example, discard setting information that determines whether to discard defective components in discard box 58 when defective components are found.

When the various types of information are received in this manner, CPU 71 peels off the top film adhered to the upper face of the tape (S110, the film-peeling step in FIG. 8A) from component supply device 22 and images the upper face of component 60 exposed from the tape with mark camera 28 (S120, the imaging step in FIG. 8B). CPU 71 then processes the captured image to recognize the component outer shape and identify the actual position of the positioning target center in the component outer shape (S130). CPU 71 then calculates positional deviation amounts $\Delta X$, $\Delta Y$ in the X-axis direction and the Y-axis direction between the actual position of the positioning target center and the inputted idealized position (S140).

When the positional deviation amounts $\Delta X$, $\Delta Y$ are calculated, CPU 71 determines whether the positional deviation amounts $\Delta X$, $\Delta Y$ are within the allowable range for the positional deviation (S150). If it is determined that the positional deviation amounts $\Delta X$, $\Delta Y$ are within the allowable range for the positional deviation, CPU 71 corrects the target arrangement position (Xs, Ys) by shifting the inputted target arrangement position (Xs, Ys) in the opposite direction by the positional deviation amounts $\Delta X$, $\Delta Y$ (S160). Next, CPU 71 causes XY robot 30 to move head 40 above glue tool station 54, and attaches glue tool 44 to head 40 (S170, the glue tool attachment step in FIG. 8C). CPU 71 then causes XY robot 30 to move head 40 (glue tool 44) above the target arrangement position (Xs, Ys) of board B and causes head 40 to apply the adhesive to board B (S180, the adhesive application step in FIG. 8D).

Next, CPU 71 moves head 40 over glue tool station 54, stores glue tool 44 in glue tool station 54, and then moves head 40 over mounting tool station 52 to attach mounting tool 42 on head 40 (S190, the mounting tool attachment step in FIG. 8E). Next, CPU 71 picks up the component with the suction nozzle of mounting tool 42 (S200), moves head 40 (i.e., mounting tool 42) above component camera 26 by controlling XY robot 30, and images the lower face of the component picked up by the suction nozzle (S210). CPU 71 then moves head 40 so that the positioning target center coincides with the target mounting position (Xm, Ym) of board B and then causes head 40 to mount the component to board B (S220, see mounting step of FIG. 8F). Head 40 is moved by identifying the position of the component outer shape with reference to XY robot 30 based on the image obtained by imaging in S210, and controlling the XY robot 30 based on the position of the identified component outer shape and the position of the positioning target center in the component outer shape identified in S130. CPU 71 may omit the process of S210 (i.e., imaging of the lower face of the component). In this case, CPU 71 may identify the position of the positioning target center with reference to XY robot 30 based on the image obtained by the process of S120 (i.e., imaging the upper face of the component), and control XY robot 30 so that the position of the identified positioning target center coincides with the target mounting position (Xm, Ym) of board B.

Figure 9:
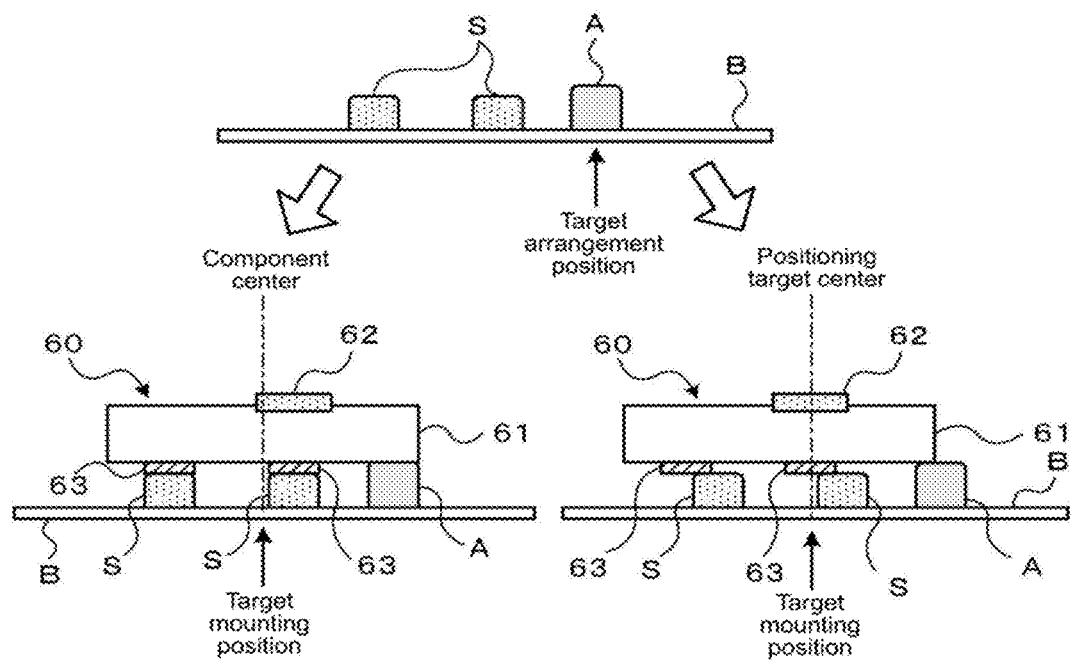
FIG. 9 A diagram showing a mounting operation in a comparative example.

FIG. 9 is a diagram showing a mounting operation in a comparative example. When light-emitting section 62 of component 60 deviates from the component center, component mounter 10 applies adhesive A to the original target arrangement position (Xs, Ys) on board B and then mounts component 60 on board B so that the component center coincides with the target mounting position (Xm, Ym), causing the positioning target center to deviate from the target mounting position. However, with component mounter 10, if component 60 is mounted on board B so that the center of the positioning target coincides with the target mounting position, the component center deviates from the target mounting position. As a result, adhesive A may not be sufficiently in contact component main body 61 to properly position (i.e., fix) component 60 on board B.

Figure 10:
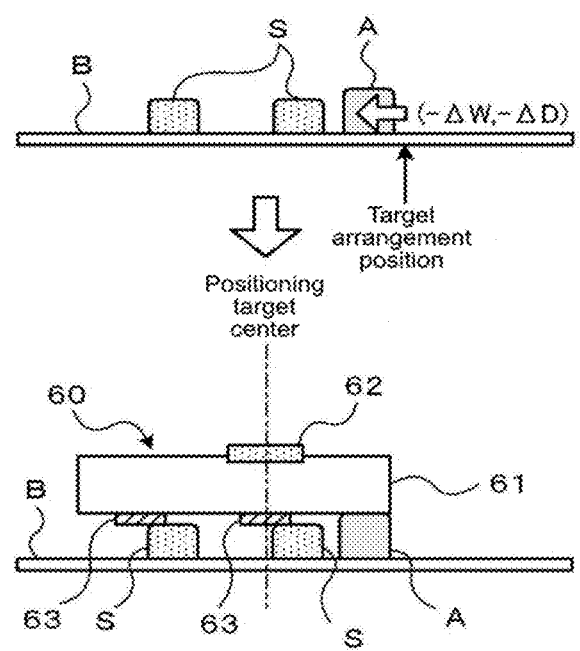
FIG. 10 A diagram showing a mounting operation in the present embodiment.

FIG. 10 is a diagram showing a mounting operation in the present embodiment. In component mounter 10 of the present embodiment, when light-emitting section 62 of component 60 deviates from the component center, the target arrangement position (Xs, Ys) is shifted in the opposite direction by the deviation amount, and adhesive A is applied to board B. As a result, even when component 60 is mounted on board B such that the positioning target center coincides with the target mounting position Xm, Ym and the component center deviates from the target mounting position, adhesive A is brought into contact with component main body 61 at an appropriate position. As a result, component 60 can be properly positioned (i.e., fixed) on board B.

When the component is mounted on board B in this manner, CPU 71 determines whether there is a next component to be mounted (S230), returns to S100 to repeat the process when it is determined that there is a next component, and ends the component mounting process when it is determined that there is no next component.

If it is determined in S150 that the positional deviation amounts ΔX, ΔY are not within the allowable range for the positional deviation, CPU 71 determines that the component is a defective component and then determines whether to discard the defective component based on the discard setting information inputted in S100 (S240). Upon deciding to discard the defective component, CPU 71 picks up the defective component using the mounting tools attached to head 40, moves head 40 above discard box 58, discards defective component to discard box 58 (S260) and proceeds to S230. On the other hand, if CPU 71 decides not to discard defective component, CPU 71 skips picking up the defective component (S270) and proceeds to S230.

Here, the correspondence between the main elements of the embodiment and the main elements of the present disclosure described in the disclosure section will be described. That is, head 40 corresponds to "at least one head", mark camera 28 corresponds to a "positional deviation detection device", and control device 70 that executes the component mounting process of FIG. 5 corresponds to a "control device". Mounting tool 42 and glue tool 44 correspond to "tools".

Component mounting system 1 of the present embodiment described above detects positional deviation of the positioning target (i.e., light-emitting section 62) in the component outer shape, corrects the arrangement position based on the detected positional deviation, and arranges the positioning material (i.e., adhesive) on board B. Component mounting system 1 then performs a mounting operation for mounting component 60 on board B by aligning the positioning target with the target mounting position of the board on which the positioning material has been arranged. As a result, when component 60 is aligned so as to position and mount component 60 at a target mounting position on board B, the positioning material can be arranged to properly position component 60.

Further, component mounting system 1 of the present embodiment determines whether the amount of positional deviation of the positioning target in the component outer shape is within the allowable range for the positional deviation, and when the amount of positional deviation is within the allowable range, component mounting system 1 performs the arrangement operation and the mounting operation, and when the amount of positional deviation is not within the allowable range, component mounting system 1 determines that the component is a defective component and performs the discarding operation or skips picking up of the component. This prevents defective components from being mounted on the board.

Further, component mounting system 1 of the present embodiment includes one head 40 to which a mounting tool and a glue tool can be attached and detached, and the glue tool is attached to head 40 when the arrangement operation is performed, and the mounting tool is attached to head 40 when the mounting operation is performed. As a result, it is possible to perform the arrangement operation and the mounting operation with one head 40 by exchanging the tool, making it possible to further miniaturize component mounter 10.

The present disclosure is not limited in any way to the above-mentioned embodiment, and it is needless to say that the present disclosure can be implemented in various forms as long as they fall within the technical scope of the present disclosure.

Figure 11:
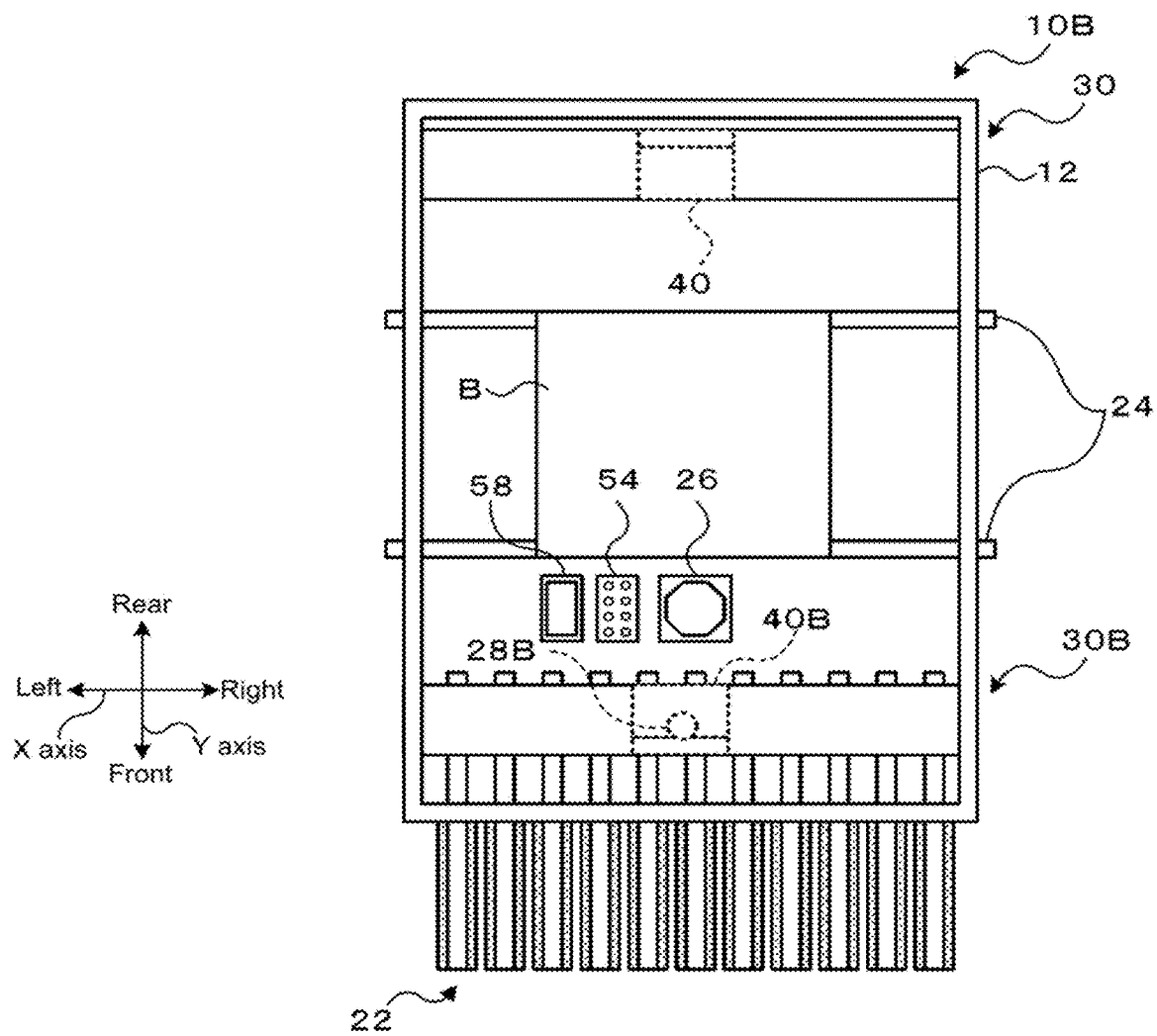
FIG. 11 A top view showing component mounting device 10B in another embodiment.

For example, in the embodiment described above, component mounter 10 is provided with one head 40 capable of exchanging multiple types of tools, and the arrangement operation is enabled by attaching the glue tool to head 40 and the mounting operation is enabled by attaching the mounting tool to head 40. However, the component mounter may separately provide a head capable of executing the arrangement operation and a head capable of executing the mounting operation. FIG. 11 is a schematic configuration diagram showing component mounter 10B of another embodiment. Component mounter 10B differs from component mounter 10 of the present embodiment in that it includes another head 40B in addition to head 40 and does not include mounting tool station 52 and glue tool station 54. Head 40 has a dispenser for applying adhesive and is movable in the XY direction by XY robot 30. On the other hand, head 40B has a suction nozzle for picking up components and mark camera 28B for imaging the upper face of the component and is movable in the XY direction independently of head 40 by XY robot 30B. Heads 40, 40B may be configured so that multiple types of tools can be exchanged or may be configured so that tools cannot be exchanged. Component mounter 10B according to the modification uses head 40 to apply the adhesive (S180), mount the component on board B using head 40B (S210, S220), and discard the defective component (S250, S260). Thus, S170, S190 of the component mounting process of FIG. 7 can be omitted.

Figure 12:
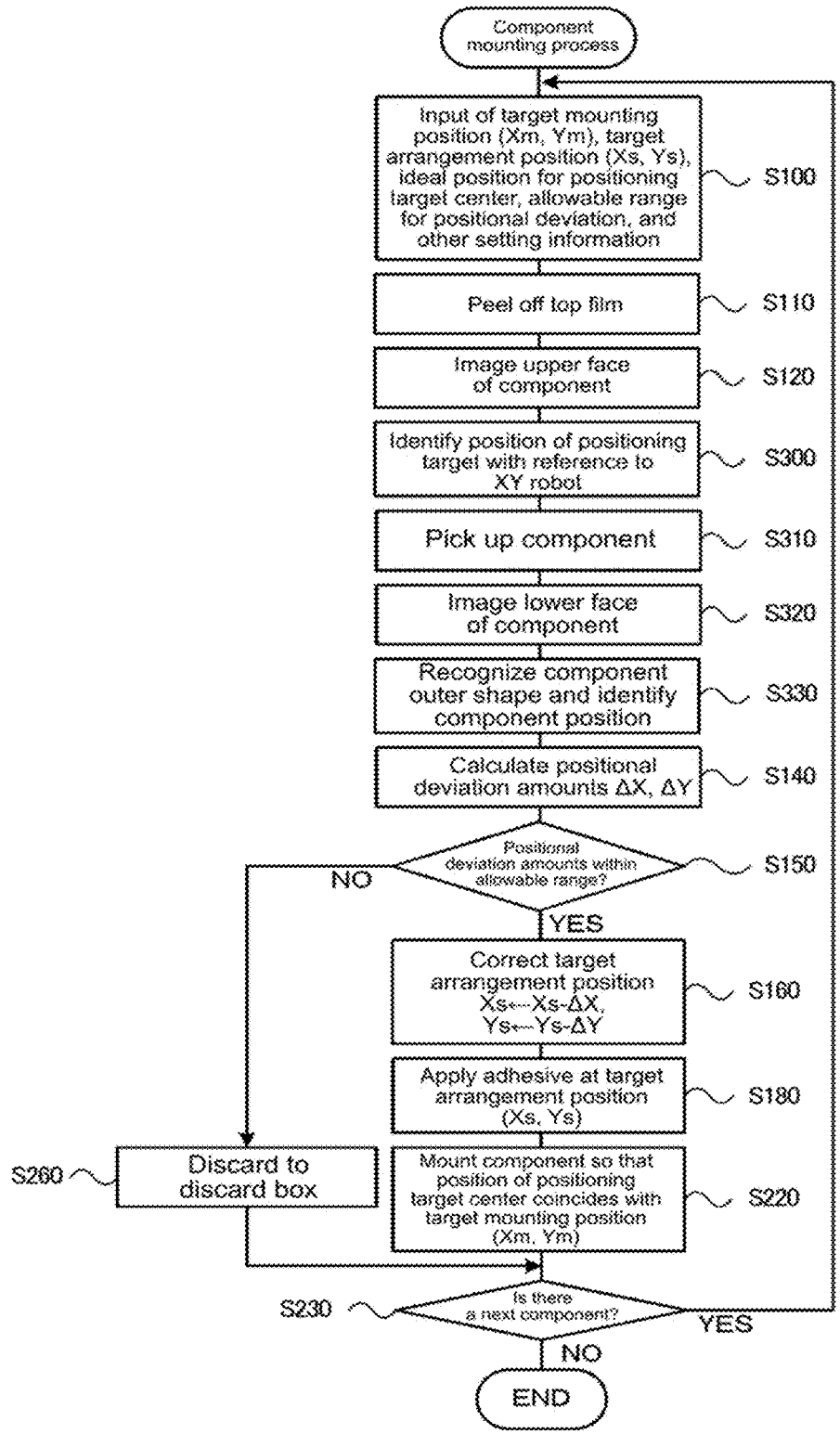
FIG. 12 A flowchart showing a component mounting process in another embodiment.

Component mounter 10B of the modification may execute the component mounting process of FIG. 12 instead of the component mounting process of FIG. 7. In FIG. 12, the same step numbers are assigned to the same steps as those in FIG. 7. Hereinafter, the component mounting process of FIG. 12 will be described focusing on a portion different from the component mounting process of FIG. 7. When the component mounting process of FIG. 12 is executed, CPU 71 of control device 70 images the upper face of the component in S120 and then processes the obtained image to identify the position of the positioning target center with reference to XY robot 30B without recognizing the component outer shape (S300). Subsequently, CPU 71 picks up the component using the suction nozzle of head 40B (S310) and causes XY robot 30B to move the picked up component above component camera 26 to image the lower face of the component (S320). CPU 71 then processes the image obtained by the imaging to recognize the component outer shape, identifies the position of the component outer shape and the actual position of the positioning target center in the component outer shape (S330) and calculates the positional deviation amounts ΔX, ΔY in S140. As described above, in the component mounting process of the other embodiment, the component outer shape is recognized using the captured image obtained by imaging the lower face of the component with component camera 26 instead of the captured image obtained with mark camera 28. Such a process is effective when, for example, the color of the component is similar to the color of the tape accommodating the component and it is difficult to recognize the component outer shape only by imaging the upper face of the component. The process of S320 may be omitted if the component outer shape can be recognized just by the captured image of the upper face of the component.

After calculating the positional deviation amounts ΔX, ΔY in S140, CPU 71 determines whether the positional deviation amount is within the allowable range for the positional deviation in S150, and if it determines that the positional deviation amount is within the allowable range for the positional deviation, CPU 71 corrects the target arrangement position (Xs, Ys) by the amount of the positional deviation amounts ΔX, ΔY in S160. CPU 71 then applies an adhesive (S180) to the corrected target arrangement position (Xs, Ys) with head 40, mounts the component picked up in S310 on board B so that the positioning target center coincides with the target mounting position (Xm, Ym) (S220), and proceeds to S230. On the other hand, when CPU 71 determines that the positional deviation amounts ΔX, ΔY are not within the allowable range for the positional deviation, CPU 71 discards the component picked up in S310 to discard box 58 (S260) and proceeds to S230.

In the embodiment described above, a thermosetting adhesive is used as the positioning material for positioning the component on board B, but the present disclosure is not limited thereto, and an adhesive tape or the like may be used.

In the embodiment described above, the arrangement operation and the mounting operation are executed in the same device (i.e., component mounter 10), but the arrangement operation and the mounting operation may be executed in different devices. In this case, a device for performing the arrangement operation may be disposed upstream along the board conveyance line from the device performing the mounting operation.

With an embodiment of the component mounting system of the present disclosure, even when the positioning target deviates from the component body, the electronic component can be more reliably positioned (i.e., fixed) on the board.

With an embodiment of the component mounting system of the present disclosure, it is possible to prevent defective components from being mounted on a board.

Furthermore, with an embodiment of the component mounting system of the present disclosure, the component mounting system can be further miniaturized.

The present disclosure may be in the form of a component mounting method in addition to the form of a component mounting system.

INDUSTRIAL APPLICABILITY

The present disclosure can be applied to the manufacturing industry of component mounting systems and the like.

REFERENCE SIGNS LIST

1 Component mounting system, 10, 10B Component mounter, 11 Base, 12 Housing, 22 Component supply device, 24 Board conveyance device, 26 Component camera, 28, 28B Mark camera, 30, 30B XY robot, 31 X-axis guide rail, 32 X-axis slider, 33 Y-axis guide rail, 34 Y-axis slider, 40, 40B Head, 42 Mounting tool, 44 Glue tool, 52 Tool station, 54 Glue tool station, 56 Nozzle station, 58 Discard box, 60 Electronic component (component), 61 Component main body, 62 Light-emitting section (positioning target), 63 Electrode, 70 Control device, 71 CPU, 72 ROM, 73 HDD, 74 RAM, 75 Input/output interface, 76 Bus, 100 Management device, 101 CPU, 102 ROM, 103 HDD, 104 RAM, 105 Input/output interface, 107 Input device, 108 Display, B Board, S Solder, A Adhesive, PC Component center, FC Light-emitting center

The invention claimed is:

1. A component mounting system configured to hold an electronic component having a positioning target on an upper face thereon and mount the electronic component on a board by performing alignment so as to position the positioning target at a predetermined position on the board, the component mounting system comprising:
    at least one head configured to be used for an arrangement operation for arranging a positioning material for positioning the electronic component relative to the board, and a mounting operation for mounting the electronic component on the board;
    a camera configured to detect a positional deviation of the positioning target on the upper face of the electronic component; and
    a control device configured to execute
    the arrangement operation by controlling the at least one head so as to arrange the positioning material on the board by correcting an arrangement position based on the positional deviation of the positioning target on the upper face of the electronic component detected with the camera, and
    the mounting operation by controlling the at least one head so as to align the positioning target to the predetermined position on the board on which the positioning material has been arranged and mount the electronic component on the board.

2. The component mounting system of claim 1, wherein the control device performs the arrangement operation in a manner such that the positioning material is disposed at the arrangement position shifted, by an amount equal to the positional deviation, in a direction opposite to the positional deviation.

3. The component mounting system of claim 1, wherein the control device determines whether the positional deviation of the positioning target on the upper face of the electronic component is within an allowable range, and
    wherein the control device performs the arrangement operation and the mounting operation when it is determined that the positional deviation is within the allowable range, and the control device does not perform the arrangement operation and the mounting operation when it is determined that the positional deviation is not within the allowable range.

4. The component mounting system of claim 3, wherein the control device executes a discarding operation in which the at least one head is controlled so as to hold and discard the electronic component when it is determined that the positional deviation of the positioning target on the upper face of the electronic component is not within the allowable range.

5. The component mounting system of claim 1, wherein the at least one head is configured to be used for the arrangement operation and the mounting operation by exchanging an attached tool, and the control device performs the arrangement operation, exchanges the attached tool on the at least one head, and then performs the mounting operation.

6. A component mounting method for holding an electronic component including a positioning target on an upper face thereon and mounting the electronic component on a board by aligning the positioning target to a predetermined position on the board, the component mounting method comprising:
    detecting a positional deviation of the positioning target on the upper face of the electronic component;
    arranging a positioning material on the board by correcting an arrangement position of the positioning material based on the positional deviation of the positioning target on the upper face of the electronic component; and mounting the electronic component on the board by aligning the positioning target to the predetermined position of the board on which the positioning material has been arranged.

\* \* \* \* \*